United States Patent
Boehme et al.

(10) Patent No.: US 11,933,831 B2
(45) Date of Patent: Mar. 19, 2024

(54) METHOD FOR MONITORING AT LEAST ONE Y-CAPACITANCE OF AN ELECTRICAL ON-BOARD POWER SUPPLY OF A VEHICLE, AND ELECTRICAL ON-BOARD POWER SUPPLY

(71) Applicant: Mercedes-Benz Group AG, Stuttgart (DE)

(72) Inventors: Urs Boehme, Ehningen (DE); André Haspel, Sindelfingen (DE)

(73) Assignee: Mercedes-Benz Group AG, Stuttgart (DE)

( * ) Notice: Subject to any disclaimer, the term of this patent is extended or adjusted under 35 U.S.C. 154(b) by 90 days.

(21) Appl. No.: 17/766,993

(22) PCT Filed: Sep. 28, 2020

(86) PCT No.: PCT/EP2020/077023
§ 371 (c)(1),
(2) Date: Apr. 6, 2022

(87) PCT Pub. No.: WO2021/069240
PCT Pub. Date: Apr. 15, 2021

(65) Prior Publication Data
US 2023/0280385 A1 Sep. 7, 2023

(30) Foreign Application Priority Data
Oct. 7, 2019 (DE) .................. 10 2019 006 969.2

(51) Int. Cl.
*G01R 31/00* (2006.01)
*B60L 3/00* (2019.01)
*G01R 31/40* (2020.01)
(52) U.S. Cl.
CPC .......... *G01R 31/007* (2013.01); *B60L 3/0046* (2013.01); *G01R 31/40* (2013.01)

(58) Field of Classification Search
CPC ...... G01R 31/007; G01R 31/40; G01R 31/52; G01R 27/18; G01R 31/006; G01R 27/26;
(Continued)

(56) References Cited

U.S. PATENT DOCUMENTS

| 2020/0041555 A1* | 2/2020 | Litz .................... B60L 3/0046 |
| 2020/0398774 A1* | 12/2020 | Eslami .................. B60L 3/0069 |
| 2022/0289034 A1* | 9/2022 | Bitenc .................. B60L 3/0046 |

FOREIGN PATENT DOCUMENTS

| CN | 107238758 A | 10/2017 |
| CN | 109342823 A | 2/2019 |

(Continued)

OTHER PUBLICATIONS

PCT/EP2020/077023, International Search Report dated Jan. 13, 2021 (Two (2) pages).

(Continued)

*Primary Examiner* — Giovanni Astacio-Oquendo
(74) *Attorney, Agent, or Firm* — Crowell & Moring LLP

(57) ABSTRACT

A method for monitoring at least one Y-capacitance of an electrical on-board power supply of a vehicle includes ascertaining a current capacitance value of the at least one Y-capacitance and a current on-board power supply voltage of the electrical on-board power supply. The method further includes determining a currently stored amount of energy in the at least one Y-capacitance depending on the current on-board power supply voltage of the electrical on-board power supply and the current capacitance value of the at least one Y-capacitance of the electrical on-board power supply, comparing the currently stored amount of energy in the at least one Y-capacitance to a predetermined threshold value, and generating a control signal when the predetermined threshold value is exceeded in the comparing.

5 Claims, 1 Drawing Sheet

(58) Field of Classification Search
CPC ... G01R 31/00; B60L 3/0046; B60L 2250/10; B60L 3/04; B60L 3/12; B60L 3/0069; Y02T 10/70; B60R 16/03
USPC .................................. 324/764.01, 537, 500
See application file for complete search history.

(56) References Cited

FOREIGN PATENT DOCUMENTS

| CN | 109624718 A | 4/2019 |
|----|-------------|--------|
| DE | 10 2015 016 000 A1 | 8/2016 |
| DE | 10 2017 008 840 A1 | 3/2018 |
| DE | 10 2018 002 926 A1 | 9/2018 |
| JP | 2014-126382 A | 7/2014 |

OTHER PUBLICATIONS

Anonymous, "ISO 6469-3:2018(E) Electrically propelled road vehicles—Safety specifications—Part 3: Electrical safety", vol. ISO 6469-3:2018, Oct. 1, 2018, pp. 1-8, URL: https://www.sis.se/std-80006958.

Anonymous, "ISO 6469-4:2015 Electrically propelled road vehicles—Safety specifications—Part 4: Post crash electrical safety", vol. ISO 6469-4:2015, Sep. 1, 2015, pp. 1-20, URL: https://www.iso.org/standard/60584.html, XP009509810.

Anonymous, "ISO 17409:2020 Electrically propelled road vehicles—Conductive power transfer—Safety requirements", vol. ISO 17409:2020, Feb. 1, 2020, pp. 1-11, URL: https://www.sis.se/std-80020461.

Texas Instruments, "Sae J1772—Compliant Electric Vehicle Service Equipment Reference Design for Level 1 and 2 EV Charger", Design Guide TIDA-010071, Oct. 2019, pp. 1-38.

Japanese Office Action issued in Japanese application No. 2022-518853 dated Feb. 22, 2023, with partial English translation (Six (6) pages).

Chinese-language Chinese Office Action issued in Chinese Application No. 202080064786.7 dated Nov. 18, 2023, with partial English translation (11 pages).

* cited by examiner

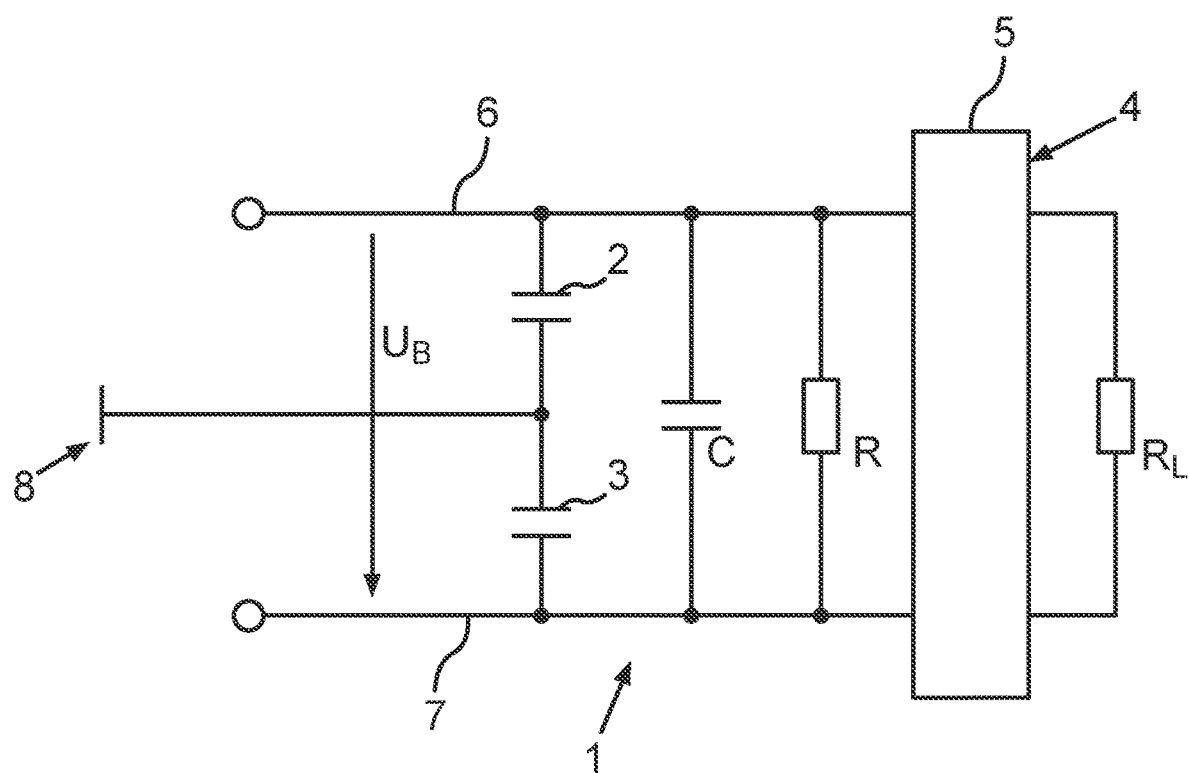

METHOD FOR MONITORING AT LEAST ONE Y-CAPACITANCE OF AN ELECTRICAL ON-BOARD POWER SUPPLY OF A VEHICLE, AND ELECTRICAL ON-BOARD POWER SUPPLY

BACKGROUND AND SUMMARY OF THE INVENTION

The invention relates to a method for monitoring at least one Y-capacitance of an electrical on-board power supply of a vehicle. Furthermore, the invention relates to an electrical on-board power supply of a vehicle having at least one Y-capacitance.

In an electrically driven vehicle, isolation errors in the on-board power supply can result in increased currents. In order to be able to limit stored electrical energy in the Y-capacitances of the on-board power supply, these Y-capacitances are designed in such a way that they can only have a maximum amount of energy.

DE 10 2018 002 926 A1 discloses an electrical on-board power supply for a motor vehicle, having at least one first and a second electrical potential line, wherein the on-board power supply is formed to be supplied with an electrical DC voltage in an intended operation between the potential lines. The on-board power supply has at least one Y-capacitor which is electrically coupled to a first port with a first potential line and to a second port with an electrical reference potential, wherein an operating lever is switched in series in relation to the at least one Y-capacitor.

DE 10 2017 008 840 A1 discloses an electrical on-board power supply for a motor vehicle that can be driven with at least one electrical engine, having a vehicle battery, a switched energy converter for supplying the electrical engine in an intended driving operation of the motor vehicle with an electrical engine voltage. The switched energy converter has a DC voltage intermediate circuit, which is electrically coupled to the vehicle battery and which has at least one Y-capacitor for producing an electromagnetic compatibility. An AC voltage charging unit attached to a vehicle battery is formed to be attached to a charging station external to the motor vehicle and to be supplied with an AC current on the side of the charging station. The AC voltage intermediate circuit is electrically coupled to a vehicle battery by means of a switching unit, wherein the switching unit is formed to electrically separate the DC voltage intermediate circuit when charging the vehicle battery by means of the AC voltage charging unit from the vehicle battery.

Here, a disadvantage emerges that, with conventional methods, the energy content in a Y-capacitance is not checked as to whether a user of the vehicle can receive an electric shock.

The object of the present invention is to provide a method and an electrical on-board power supply, with which an increased degree of voltage safety can be provided in HV systems, in particular in vehicles with voltages of 800 Volt.

One aspect of the invention relates to a method for monitoring at least one Y-capacitance of an electrical on-board power supply of a vehicle. A current capacitance value of the at least one Y-capacitance and a current on-board power supply of the electrical on-board power supply are ascertained, wherein a currently stored amount of energy in the at least one Y-capacitance is determined depending on the current on-board power supply of the electric on-board power supply and the current capacitance value of the at least one Y-capacitance of the electrical on-board power supply. The currently stored energy in the at least one Y-capacitance is compared to a predetermined threshold value, and a corresponding signal is generated when the predetermined threshold value is exceeded. By using the proposed method, an increased degree of safety, in particular of a degree of voltage safety with high voltage systems, can in particular be achieved in vehicles. In particular, the proposed method can be used to monitor the at least one Y-capacitance in electrically operated vehicles with voltage levels of 800 Volt. In particular, the monitoring of at least one Y-capacitance can be implemented with simple means and functionally expanded with the aid of existing insulating monitors of electrically operated vehicles. For example, the determination of the amount of stored energy in the at least one Y-capacitance can be implemented cost-effectively and simply with the aid of an integrated software function in the electrical on-board power supply or in a control unit of the electrical on-board power supply.

In order to avoid endangering a user of the vehicle, the predetermined threshold value for the currently stored energy with at least one Y-capacitance is predetermined by means of the following exemplary standards, ISO 6469-3, SAE J 1772 or ISO 17409. For example, to avoid endangering the user, the maximum energy content per HV potential can be set to 200 mJ. Thus, a user can be protected from an electric shock.

The Y-capacitance of the electrical on-board power supply of the vehicle can be, for example, an interference suppression capacitor, radio interference suppression capacitor or a safety capacitor. These conduct high frequency disruptive signals that have been caused by the operation of electrical or electronic equipment, in opposition to the mass or the neutral conductor, or short circuit these and thus cause the decrease of the electromagnetic currents.

The electrical on-board power supply is, in particular, a high voltage system of an electrically operable vehicle or a hybrid vehicle. For example, the current capacitance value of the at least one Y-capacitance can be determined using an evaluation unit, and the current on-board power supply voltage of the electrical on-board power supply can be determined using a voltage meter. With the aid of the evaluation unit, the currently stored energy in the at least one Y-capacitance can be ascertained or determined depending on the ascertained current on-board power supply voltage of the electrical on-board power supply and the current capacitance value of the at least one Y-capacitance of the electrical on-board power supply. In particular, the currently stored energy is a maximum amount of energy of the at least one Y-capacitance. For example, the current on-board power supply voltage can be a current HV intermediate circuit voltage. For example, the evaluation unit and the voltage measuring unit can be integrated in an HV control device, whereby a compact unit for monitoring the at least one Y-capacitance can be provided. For example, the HV control device can be an insulation monitor or an HV component with a voltage detection unit.

For example, the corresponding control signal can be generated by the HV control device when the currently stored energy in the at least one Y-capacitance exceeds the predetermined threshold value and is transmitted to a safety component of the electrical on-board power supply of the vehicle.

In particular, when the predetermined threshold value is exceeded, a warning signal can be emitted to the user of the vehicle and/or the electrical on-board power supply can be deactivated and/or the at least one Y-capacitance can be discharged. This results in the best possible protection of the user of the vehicle in the event of an error in the insulation, for example.

A further aspect of the invention relates to an electrical on-board power supply of the vehicle having at least one Y-capacitance. The electrical on-board power supply comprises a control unit for ascertaining a current capacitance value of the at least one Y-capacitance and a current on-board power supply voltage of the electrical on-board power supply. Similarly, the electrical on-board power supply comprises an evaluation unit for determining a currently stored amount of energy in the at least one Y-capacitance of the electrical on-board power supply depending on the current capacitance value of the at least one Y-capacitance and on the current on-board power supply voltage of the electrical on-board power supply. In particular, with the electrical on-board power supply, a method according to the aspect depicted above or a design thereof can be implemented. In particular, the method is implemented with the proposed electrical on-board power supply.

Further advantages, features and details of the invention emerge from the description below of preferred exemplary embodiments and by means of the drawing. The features and feature combinations mentioned above in the description and the features and feature combinations mentioned below in the description of the FIGURE and/or shown only in the single FIGURE can be used not only in the respectively specified combination, but also in other combinations or on their own, without leaving the scope of the invention.

BRIEF DESCRIPTION OF THE DRAWING

The single FIGURE shows a schematic depiction of an electrical on-board power supply.

DETAILED DESCRIPTION OF THE DRAWING

The FIGURE shows a schematic depiction of an electrical on-board power supply 1 of a vehicle. The electrical on-board power supply 1 is, for example, an HV system of an electrically operating vehicle. The electrical on-board power supply 1 has at least one Y-capacitance 2. In particular, the electrical on-board power supply 1 can have a further Y-capacitance 3. The Y-capacitance 2, 3 can, for example, be an interference suppression capacitor. The electrical on-board power supply comprises a control unit 4 with which a current capacitance value of the at least one Y-capacitance 2, and the current on-board power supply voltage $U_B$ of the electrical on-board power supply 1 can be ascertained. The control unit 4 can be, in particular, an HV control device, which has, for example, a voltage detecting unit. It is also conceivable that the control device 4 is an insulation monitor or an HV component of the vehicle. For example, the insulation monitor as the control unit 4 can be integrated with a function or a piece of function software, with which the at least one Y-capacitance 2 of the electrical on-board power supply 1 of the vehicle can be monitored. The control unit 4 has, in particular, an evaluation unit 5 or is integrated with the evaluation unit 5. With the aid of the evaluation unit 5, a currently stored amount of energy in the at least one Y-capacitance 2 depending on the current on-board power supply $U_B$ of the electrical on-board power supply 1 and the current capacitance value of the at least one Y-capacitance 2 of the electrical on-board power supply 1 are determined.

For example, the currently stored energy in the at least one Y-capacitance 2 can be calculated using the following formula:

$$W = \tfrac{1}{2} * C * U^2.$$

For example, the current on-board power supply $U_B$ and the current capacitance values of the Y-capacitance 2, 3 is used in the formula just shown in order to be able to calculate the current amount of energy. With the energy amount of the Y-capacitance 2, it must be taken into consideration that, with an increased HV voltage of the vehicle, the amount of energy in the Y-capacitance 2, 3 increases quadratically with the voltage. This can be defined, in particular, in the evaluation unit 5 of the control unit 4.

In particular, the currently stored amount of energy in the at least one Y-capacitance 2 can be compared to a predetermined threshold value. This can take place, in particular, with the aid of the evaluation unit 5 of the control unit 4. In particular, when the currently stored energy in the at least one Y-capacitance 2 exceeds the predetermined threshold value, a corresponding control signal is generated by the control unit 4. The generated control signal can be sent to a safety device of the vehicle, for example. For example, with the aid of the generated control signal, a warning signal can be emitted in the vehicle. Thus, a user of the vehicle, in particular, can be warned of a possible electric shock. Similarly, with the aid of the generated control signal, the electrical on-board power supply 1 can be deactivated or separated from a battery. Similarly, with the aid of the generated sent control signal, a discharging process of the at least one Y-capacitance 2, 3 can be carried out.

For example, a first voltage between a first or a second potential voltage 6, 7 of the electrical on-board power supply 1 and a reference voltage 8 can be ascertained. The ascertained first voltage can be taken into consideration when determining the currently stored energy in the at least one Y-capacitance 2. In particular, ascertaining the first voltage can be carried out using the control unit 4.

For example, a second voltage between the first potential wire 6 and the reference potential 8 and a third voltage between the second potential wire 7 and of the electrical on-board power supply 1 and the reference potential 8 can be ascertained. The reference potential 8 is, in particular, an earth wire (PE). This ascertained second and third voltage can also be taken into consideration when determining the currently stored amount of energy of the at least one Y-capacitance 2. It is also conceivable that the first, second or third voltage can be used for the determination of the currently stored amount of energy of the at least one Y-capacitance 2 instead of the on-board power supply voltage 2 $U_B$.

For example, in a charging process of the vehicle on a DC charging column, a predetermined value for the current capacitance value can be predetermined. For example, here 500 nF per potential can be set.

In particular, with the ascertained currently stored amount of energy of the at least one Y-capacitance 2, an asymmetry or unsymmetry in a potential distribution of the electrical on-board power supply 2 can be checked. In particular, when setting an asymmetry or unsymmetry in the potential distribution, this can be taken into consideration and be calculated too when monitoring the at least one Y-capacitance.

LIST OF REFERENCE CHARACTERS

1 On-board power supply
2 Y-capacitance
3 Y-capacitance
4 Control unit
5 Evaluation unit 6 First potential wire
7 Second potential wire
8 Reference potential
$U_B$ On-board power supply voltage

The invention claimed is:

1. A method for monitoring at least one Y-capacitance of an electrical on-board power supply of a vehicle, comprising the steps of:
    ascertaining a current capacitance value of the at least one Y-capacitance and a current on-board power supply voltage of the electrical on-board power supply;
    determining a currently stored amount of energy in the at least one Y-capacitance depending on the current on-board power supply voltage of the electrical on-board power supply and the current capacitance value of the at least one Y-capacitance of the electrical on-board power supply;
    comparing the currently stored amount of energy in the at least one Y-capacitance to a predetermined threshold value; and
    generating a control signal when the predetermined threshold value is exceeded in the comparing.

2. The method according to claim 1, further comprising the steps of:
    ascertaining a first voltage between a first potential wire or a second potential wire of the electrical on-board power supply and a reference potential; and
    taking the ascertained first voltage into consideration when determining the currently stored amount of energy in the at least one Y-capacitance.

3. The method according to claim 1, further comprising the steps of:
    ascertaining a second voltage between the first potential wire and the reference potential and a third voltage between the second potential wire and the reference potential; and
    taking the ascertained second voltage and the third voltage into consideration when determining the currently stored amount of energy of the at least one Y-capacitance.

4. The method according to claim 1, further comprising the step of:
    checking an asymmetry in a potential distribution of the electrical on-board power supply using the currently stored amount of energy of the at least one Y-capacitance.

5. An electrical on-board power supply of a vehicle, comprising:
    at least one Y-capacitance;
    a control unit, wherein a current capacitance value of the at least one Y-capacitance and a current on-board electrical voltage of the electrical on-board power supply is ascertainable by the control unit; and
    an evaluation unit, wherein a currently stored energy in the at least one Y-capacitance of the electrical on-board power supply is determinable by the evaluation unit depending on the current capacitance value of the at least on Y-capacitance and on the current on-board electrical voltage of the electrical on-board power supply.

* * * * *